United States Patent [19]
Hartman

[11] 3,943,621
[45] Mar. 16, 1976

[54] SEMICONDUCTOR DEVICE AND METHOD OF MANUFACTURE THEREFOR

[75] Inventor: David K. Hartman, Manlius, N.Y.

[73] Assignee: General Electric Company, Syracuse, N.Y.

[22] Filed: Mar. 10, 1975

[21] Appl. No.: 556,645

Related U.S. Application Data

[62] Division of Ser. No. 454,095, March 25, 1974, abandoned.

[52] U.S. Cl. .................... 29/578; 29/588; 29/590; 357/73
[51] Int. Cl.² ........................................ B01J 17/00
[58] Field of Search ............ 29/578, 588, 589, 590, 29/591

[56] References Cited
UNITED STATES PATENTS

| | | | |
|---|---|---|---|
| 3,542,550 | 11/1970 | Conrad | 29/588 |
| 3,571,913 | 3/1971 | Bodway | 29/578 |
| 3,673,679 | 7/1972 | Carbojal | 29/578 |
| 3,689,392 | 9/1972 | Sandera | 357/73 |
| 3,697,334 | 10/1972 | Yamamoto | 29/588 |
| 3,728,784 | 4/1973 | Schmidt | 29/588 |
| 3,755,720 | 8/1973 | Kern | 357/73 |

*Primary Examiner*—W. Tupman
*Attorney, Agent, or Firm*—Robert J. Mooney; Douglas E. Stoner

[57] ABSTRACT

A semiconductor device and method of manufacture therefor includes the establishment of at least one PN junction in a semiconductor chip through conventional techniques. Electrical contacts are formed. The entire semiconductor device is coated with a passivant coating having a first layer of low temperature silicon dioxide and a second layer of glass, the second layer of glass being applied in two steps.

2 Claims, 26 Drawing Figures

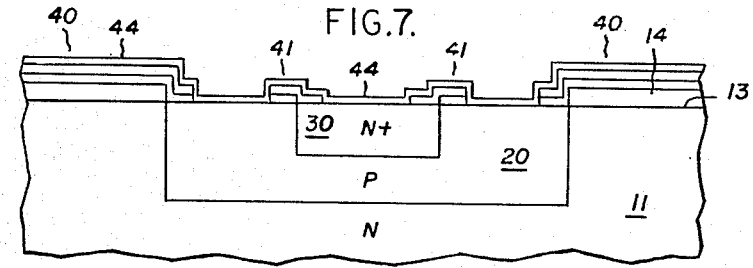
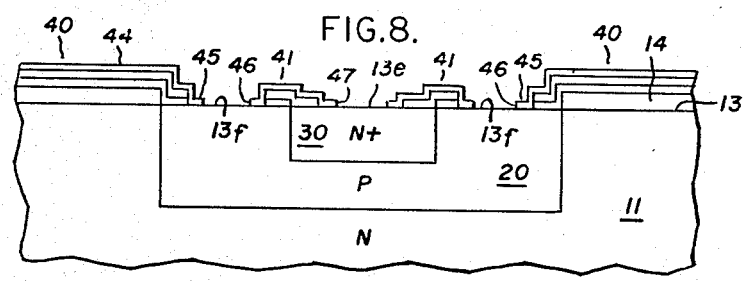
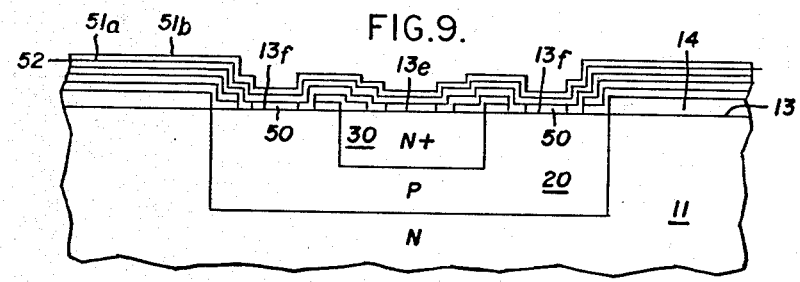
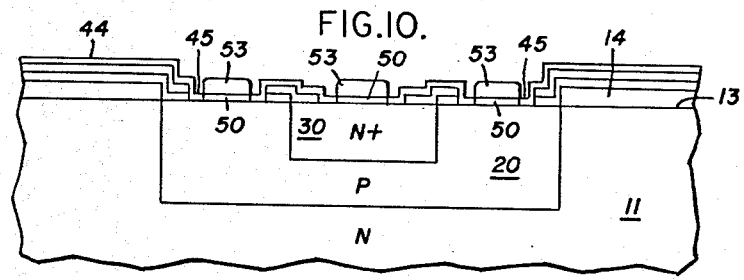
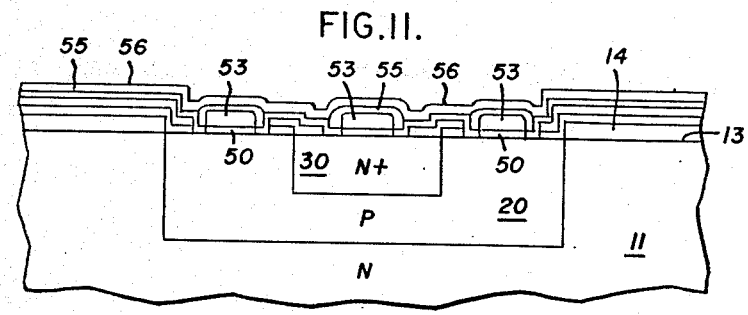
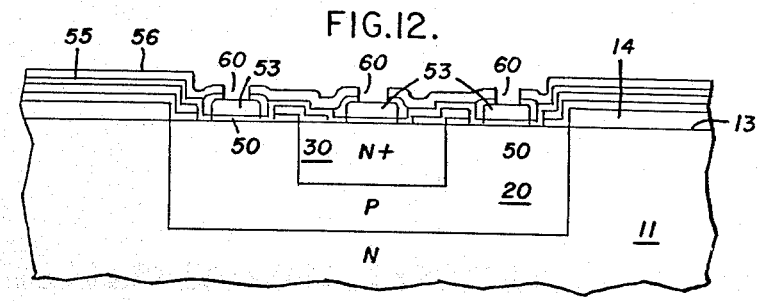

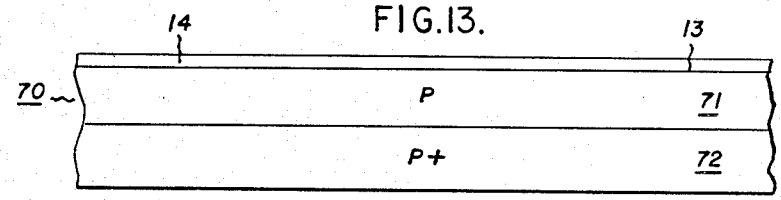
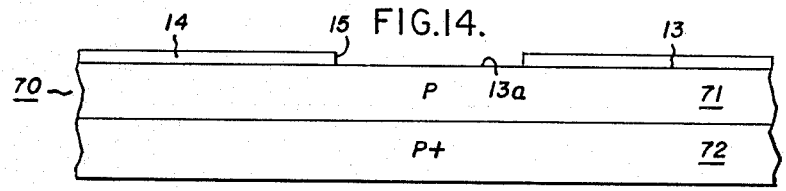
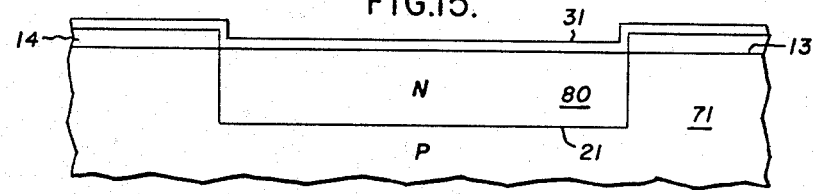
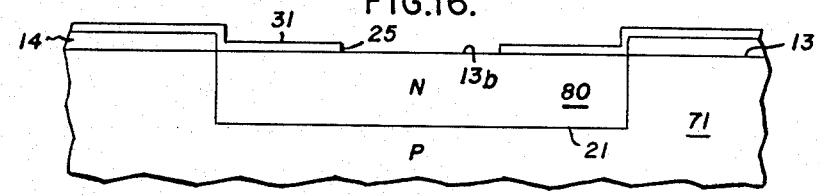
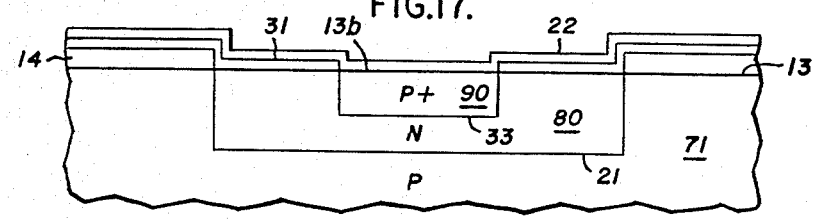
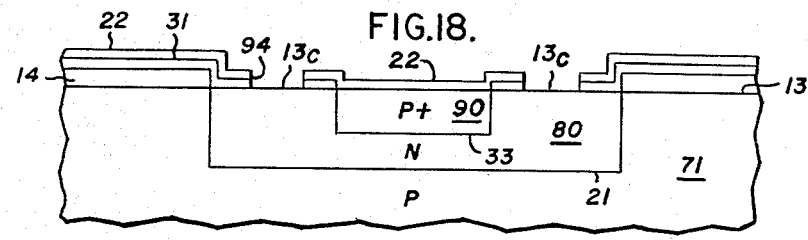
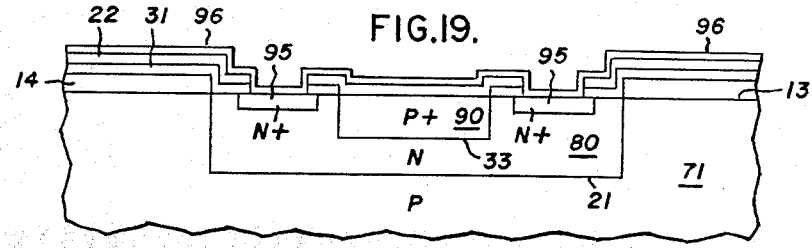

SEMICONDUCTOR DEVICE AND METHOD OF MANUFACTURE THEREFOR

The invention herein described was made in the course of, or under, a contract or subcontract thereunder with the Department of the Army.

This is a division, of application Ser. No. 454,095 filed Mar. 25, 1974, entitled "Semiconductor Device and Method of Manufacture Therefor", now abandoned.

BACKGROUND OF THE INVENTION

1. Field of the Invention

The invention is directed to semiconductor devices and to methods for passivating semiconductor devices.

2. Description of the Prior Art

Semiconductor devices employing planar passivation are well known in the art. A substrate, or chip, of semiconductor material such as silicon or germanium is covered on one surface by an oxide material such as silicon dioxide. Through photolithographic techniques, windows are cut in the oxide material so that a portion of the chip is exposed. In order to define transistor junctions within the chip, impurities such as boron and phosphorus may be diffused into the chip through the windows. A plurality of transistor junctions may be formed, provided that an oxide layer covers all portions of the surface of the chip other than those through which an impurity is to be diffused.

In order to protect the chip and the transistor junctions diffused therein, one may provide an insulating layer of an oxide over which a barrier comprising a layer of silicon nitride is formed. The silicon nitride is a denser dielectric than silicon dioxide and inhibits the migration of contaminating mobile ions through the dielectric to the surface of the chip. The use of a silicon nitride barrier is shown in U.S. Pat. No. 3,597,667, issued to F. H. Horn and assigned to the present assignee.

In order to provide an electrical connection to the semiconductor device, metallic electrical contacts are conventionally applied to appropriate exposed portions of the semiconductor chip. Many metals have been used as contacts, but aluminum heretofore has been the metal principally employed. As a contact, aluminum has many drawbacks, including a low melting point and a tendency to corrode. Accordingly, contacts have been developed which employ a first layer of platinum silicide upon which is formed successive layers of molybdenum and gold. The application of these constituents is effected by photolithographic techniques similar to those employed in forming the transistor junctions.

In order to protect the semiconductor device and extend its operating life by providing a barrier to alkali ion migration and moisture, a semiconductor chip is coated on all surfaces with a layer of sealing material, which sealing material commonly comprises glass.

Unfortunately, the various types of glass heretofore used as sealants have protected the semiconductor devices to less than an optimum extent. Problems have arisen with respect to cracking of the glass after deposition and difficulties in etching the glass to expose the metallic contacts. Many glasses previously used require a high firing temperature which degrades the electrical properties of the semiconductor device and which leads to alloying of the metallic contacts. Additionally, many glasses previously used have adhered poorly to the metallic contacts prior to etching, and consequently, stresses have been created, which stresses weaken both the glass and the contacts. Pinholes in the glass have allowed the entrance of alkali ions and moisture with a resulting decrease in power dissipation, reliability, and operating life.

Accordingly, it is an object of the invention to provide a semiconductor device and method of manufacture therefor wherein pinholes in the sealant are eliminated and the semiconductor device has a higher degree of reliability.

It is another object of the invention to provide a semiconductor device and method of manufacturing therefor wherein the semiconductor device has the capability to dissipate more power and has a longer operating life.

It is a further object of the invention to provide a method for forming a semiconductor device resulting in little or no alloying of metallic electrical contacts and resulting in reduced stresses between the contacts and a glass sealant.

SUMMARY OF THE INVENTION

In carrying out the invention, in one form thereof, a chip of semiconductor material is provided with transistor junctions by means of conventional photolithographic and diffusion techniques. A silicon nitride barrier is provided prior to forming metallic electrical contacts. The contacts comprise platinum silicide, molybdenum, and gold and are created by photolithographic and vapor deposition techniques. The semiconductor device is coated with a protective adherent layer of low-temperature silicon dioxide and is then coated with two thin films of glass. Windows are cut into the glass and silicon dioxide to expose the metallic electrical contacts.

DESCRIPTION OF THE DRAWINGS

FIGS. 1 through 11 are cross-sectional views of portions of a semiconductor chip showing steps in a method of manufacture for one embodiment of a semiconductor device in accordance with one form of the invention.

FIG. 12 is a cross-sectional view of one embodiment of the invention formed by the method illustrated in FIGS. 1 through 11.

FIGS. 13 through 25 are cross-sectional views of portions of a semiconductor chip showing steps in a method of manufacture for another embodiment of a semiconductor device in accordance with one form of the invention.

DESCRIPTION OF THE PREFERRED EMBODIMENTS

Figure 1:
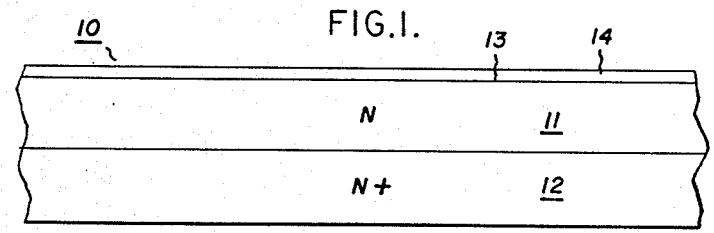

Referring to FIG. 1, a portion of a semiconductor chip 10 is disclosed, which chip is comprised of a material such as silicon or germanium. Chip 10 includes an internal region 12 of excess electron concentration, or N+ region, and a surface region 11, or N region, having an electron concentration less than that of the N+ region. The N region typically has a resistivity of 5 ohm-centimeters and is approximately 20 microns deep. The N region is also referred to as the collector when employed in a transistor.

Deposited on at least one surface 13 of chip 10 is an oxide layer 14 comprised of clean, wet silicon dioxide. Oxide layer 14 is about 10,000 A thick.

Figure 2:
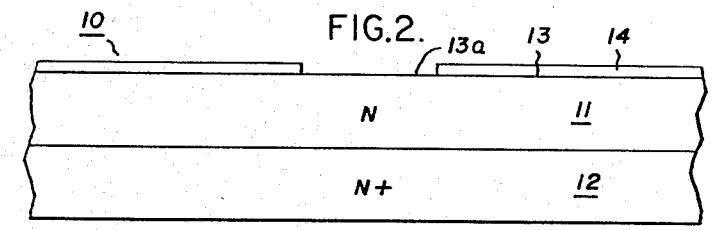

Through conventional photolithographic techniques, a window 15 is cut in oxide layer 14 so that a portion of N region 11 is exposed, as at the surface 13a. This is shown in FIG. 2. Window 15 is provided to permit the introduction of various impurities into N region 11. Since the rest of oxide layer 14 has not been disturbed, no materials can enter N region 11 except through surface 13a.

Figure 3:
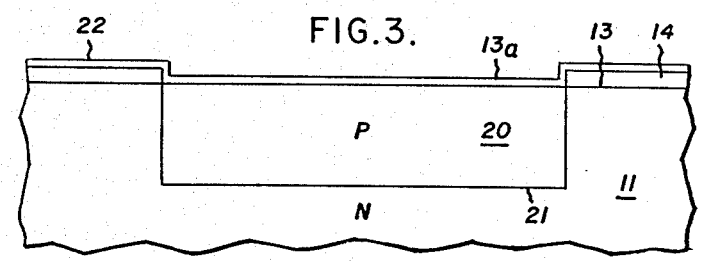

The introduction of an impurity into N region 11 is illustrated in FIG. 3. By way of example, the impurity comprises boron and is introduced into N region 11 through conventional diffusion techniques. The introduction of the boron produces a P region 20 having a hole concentration. The sheet resistivity of P region 20 is about 135 ohms per square. The P region is approximately 6 microns deep and forms a first transistor junction 21. The P region is referred to as the base.

As further illustrated in FIG. 3 is a second silicon dioxide layer 22, formed subsequent to the formation of P region 20 and deposited on surface 13a through window 15 as well as on first oxide layer 14. Oxide layer 22 is thinner than oxide layer 14, being approximately 0.9 micron thick.

Figure 4:
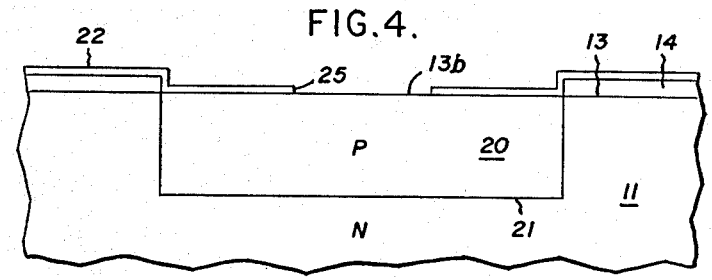

Referring to FIG. 4, a second window 25 is next formed by photolithographic techniques. Window 25 extends completely through oxide layer 22 so that a portion 13b of surface 13 is exposed. It is seen that window 25 centrally overlies P region 20 and is smaller than P region 20. The exact location of window 25 is not critical to the invention except that the window must be contained within the bounds of transistor junction 21.

Figure 5:
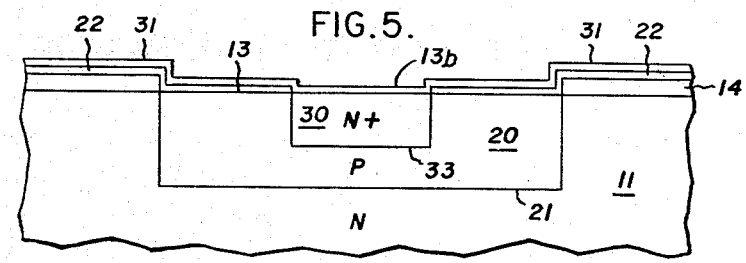

In a manner similar to the formation of P region 20 and as illustrated in FIG. 5, an impurity is diffused through window 25 into P region 20 to form N+ region 30, also referred to as the emitter. In this embodiment, N+ region 30 is formed by the diffusion of phosphorus into P region 20. N+ region 30 extends into P region 20 to a depth of about 4 microns and forms a second transistor junction 33 therewith.

The diffusion of phosphorus to form N+ region 30 simultaneously forms an oxide layer 31 on both surface 13b and previously formed oxide layer 22. The thickness of oxide layer 31 is about 0.5 micron.

Figure 6:
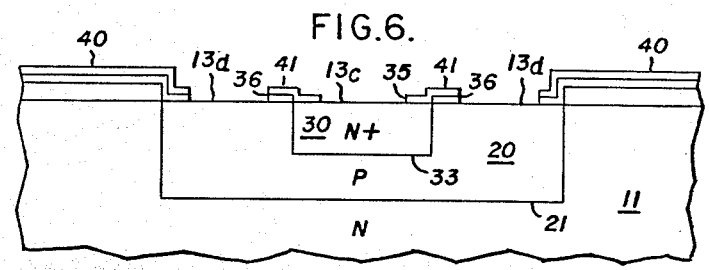
Figure 20:
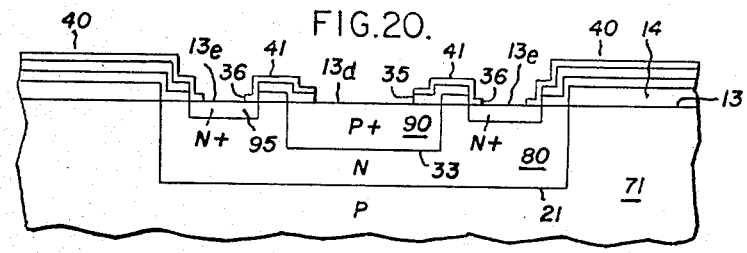
Figure 21:
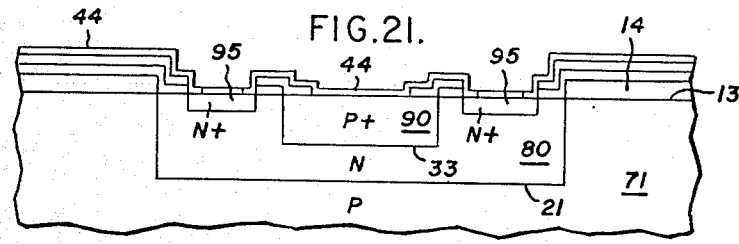
Figure 22:
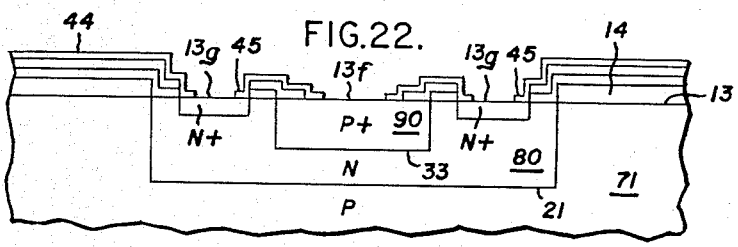
Figure 23:
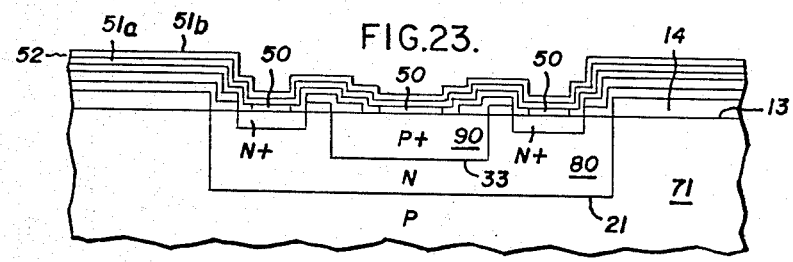
Figure 24:
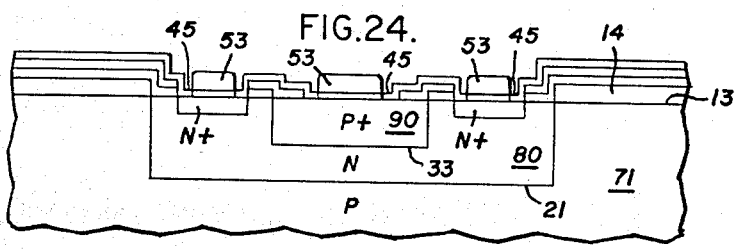
Figure 25:
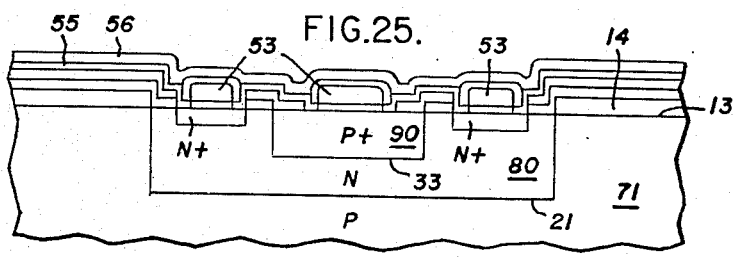

As shown in FIG. 6, window 35 and window 36 are formed in the oxide layers. As with windows 15 and 25, windows 35 and 36 extend completely through the oxide layers so that portions 13c and 13d of surface 13 are exposed. For the sake of convenience, remaining portions of the oxide layers will hereinafter be referred to as oxide layers 40 and 41. Portions 40 and 41 thus identified provide protection for transistor junctions 21 and 33.

As shown in FIG. 7, the exposed areas of surface 13 and oxide layers 40 and 41 are coated with a layer, or barrier 44, of pyrolytic silicon nitride about 1,000 A thick. Referring to FIG. 8, portions of silicon nitride barrier 44 are removed through photolithographic techniques to form windows 46 and 47 so that portions 13e and 13f of surface 13 are exposed. The silicon nitride which is left entirely covers oxide layers 40 and 41 and extends slightly beyond each oxide layer to also cover portions of surface 13. The silicon nitride barrier is a denser dielectric than silicon dioxide and inhibits the migration of contaminating mobile ions through the dielectric to surface 13. The edge seal prevents the lateral diffusion along surface 13 of contaminating mobile ions.

The semiconductor device is now ready for electrical contacts to be formed. In a manner similar to that illustrated in FIGS. 7 and 8, a 400 A layer of platinum is deposited over silicon nitride barrier 44 and exposed portions 13e and 13f of surface 13. The device is then heated to about 650°C to form platinum silicide at the interface between the platinum layer and surfaces 13e and 13f. By photolithographic techniques, platinum is removed from all portions of silicon nitride barrier 44. Thus, as shown in FIG. 9, a platinum silicide layer 50 is left on those portions 13e and 13f of surface 13 not covered previously by silicon nitride barrier 44. Conversely, all portions of silicon nitride barrier 44 shown in FIG. 8, including those portions on the edge seals 45, have been uncovered.

Referring again to FIG. 9, metallization is provided for platinum silicide layer 50, which metallization comprises a first layer of molybdenum and a second layer of gold. The objective of the metallization is to form electrical contacts. This is effected by depositing over the entire semiconductor surface a first layer 51a comprising about 5,000 A of molybdenum and a second layer 51b comprising about 5,000 A of gold, forming a molybdenum-gold layer 52. This process is carried out at a temperature of about 300° to 400°C. The surface thus covered comprises platinum silicide layer 50 and silicon nitride 44.

Through photolithographic techniques, the molybdenum-gold layer 52 is removed from the silicon nitride barrier 44, leaving only the platinum silicide layer 50 covered. This is illustrated in FIG. 10, where electrical contacts 53 are shown, which contacts 53 further comprise a first layer of platinum silicide 50 and a second layer of molybdenum-gold 52.

With the completion of the electrical contacts, the semiconductor device is ready to be passivated. The entire surface of the device, now defined by silicon nitride barrier 44 and electrical contacts 53, is covered with a layer of low-temperature silicon dioxide about 600 A thick, which layer is capable of being fired at a very low temperature. This is shown as layer 55 in FIG. 11. As also shown in FIG. 11, an additional layer 56 of glass is deposited upon layer 55, which layer of glass is about 1.6 microns thick. An example of a glass found to be particularly effective as a barrier to alkali ions and moisture is a lead borosilicate type of glass. Also, this type of glass results in lower stresses and better adherence to the contacts since its coefficient of expansion is closer to that of the contacts than other glasses. This is deposited through any well-known centrifuging technique and is fired at around 560°C. At this point, a thin layer of low-temperature silicon dioxide 55 covers silicon nitride barrier 44 and electrical contacts 53, and a layer of glass 56 covers layer 55. As shown in FIG. 12, the final step in the formation of the transistor, known as an NPN transistor, is the forming of windows 60 in glassivation layers 55 and 56 so that portions of electrical contacts 53 are exposed.

The use of a multiple sealant layer has solved the prior art problems previously mentioned. The low-temperature silicon dioxide layer 55 is capable of being fired at a very low temperature. Therefore, corrosion of the metallic electrical contacts 53 no longer occurs. Additionally, stresses between the sealant and portions of the semiconductor device remain low and cracking is greatly reduced. The silicon dioxide also adheres to the contacts better than previous sealants. It is now possible to better protect the semiconductor device with a more impervious layer of glass applied over the silicon dioxide and yet cause less damage to the semiconductor device than if the glass were applied directly to the semiconductor device. This is because of the firing temperature of the silicon dioxide is low enough so that the semiconductor device is not damaged during firing; subsequent application of the glass at a higher temperature results in little damage to the device since the previously applied silicon dioxide layer protects the device.

In order to solve problems with pinholes in the sealant, glass layer 56 is applied in two steps. A first layer is applied by centrifuging and is then fired at around 560°C. This first layer is about 1.2 microns thick. A second layer of glass similarly is applied over the first layer of glass. The second layer is about 0.4 micron thick. By applying glass layer 56 in two steps, pinholes in the first layer are covered by the second layer. This occurs with no increase in thickness of the finished product since glass layer 56 is no thicker than the single sealant layer previously used. Test results show that power dissipation, reliability, and operating life of devices with the improved sealant are greatly enhanced. For example, under very high power conditions of 1200mW, which is over three times the wattage normally encountered, 40 devices with the improved sealant experienced only a 17.5 percent failure rate, none of which were catastrophic, while all 40 of the devices without the improved sealant failed catastrophically.

An alternative embodiment of the invention is illustrated in FIGS. 13 through 26. Whereas the form of the invention first described is known in the art as an NPN device, the alternative embodiment of the invention is known as a PNP device. The manufacture of the alternative embodiment of the invention is carried out in a manner identical to that of the first-mentioned embodiment, with certain exceptions, as will be described hereinafter. The same reference numerals have been employed for corresponding parts in the two embodiments.

The most significant difference between the embodiments is that the N regions and P regions are reversed; that is, N region 11 of FIG. 1 corresponds to P region 71 of FIG. 13. An internal region 72 of excess hole concentration, or P+ region, is also provided.

Referring to FIG. 13, an oxide layer 14 of silicon dioxide is formed on surface 13. As shown in FIG. 14, a window 15 is formed in oxide layer 14 to expose surface 13a of chip 70. Through conventional diffusion techniques, an N region 80 is formed, which region forms a first transistor junction 21 therewith, as shown in FIG. 15. As with N+ region 30 and transistor junction 33 of the first embodiment, the impurity employed to form N region 80 of the second embodiment is phosphorus. The resulting N region 80 has a sheet resistance of about 100 ohms per square and is about 4 microns deep. As before, the phosphorus diffusion simultaneously produces an oxide layer 31. Oxide layer 31 is about 0.9 micron thick and is deposited on both surface 13a and oxide layer 14.

As shown in FIG. 16, window 25 is formed in oxide layer 31 to expose a portion 13b of surface 13 centrally overlying, and smaller than, N region 80. As before, the location of window 25 is not critical except to the extent that it must be contained within the bounds of transistor junction 21.

In FIG. 17, P+ region 90 is formed by diffusing boron through window 25 into N region 80. P region 90 is about 3 microns deep and forms a second transistor junction 33 therewith. An additional oxide layer 22 is simultaneously formed during the P+ diffusion to a thickness of about 0.3 micron so that oxide layer 31 and surface 13b are covered.

An additional step is now performed which distinguishes this embodiment from the first embodiment. An additional N+ region 95 is provided for N region 80. As shown in FIG. 18, this is accomplished by forming window 94 in the oxide layers so that portion 13c of surface 13 directly overlying N region 80 is exposed. Window 94 is disposed intermediate transistor junctions 21 and 33. As shown in FIG. 19, another phosphorus diffusion is carried out so that a thin N+ region 95 of about 1,000 Å thickness is formed. This is done in order to lower the subsequent metal contact resistance to N region 80. As with other phosphorus diffusions, an oxide layer is simultaneously formed with the diffusion process. This results in the production of oxide layer 96, which oxide layer is about 2,000 Å thick.

In a manner similar to that shown in FIG. 6, windows 35 and 36 are formed in the previously deposited oxide layers to expose portions 13d and 13e of surface 13. For the sake of convenience, remaining portions of the oxide layers will hereinafter be referred to as oxide layers 40 and 41. Portions 40 and 41 thus identified provide protection for transistor junctions 21 and 33.

As shown in FIGS. 21 through 25, the rest of the process corresponds exactly to that of the first embodiment. This includes a silicon nitride barrier 44 having edge seals 45 as previously described. The same metallizing process for forming electrical contacts also is employed. A first layer of platinum is converted to a platinum silicide layer 50 at the interfaces with surface 13; the excess platinum also is removed. Succeeding layers of molybdenum and gold and their appropriate selective removal form electrical contacts 53. Additionally, the identical glassivation process of the first embodiment is carried out in the second embodiment, which glassivation comprises a first layer of low-temperature silicon dioxide and a second layer of glass, which layer of glass is applied in two steps.

Figure 26:
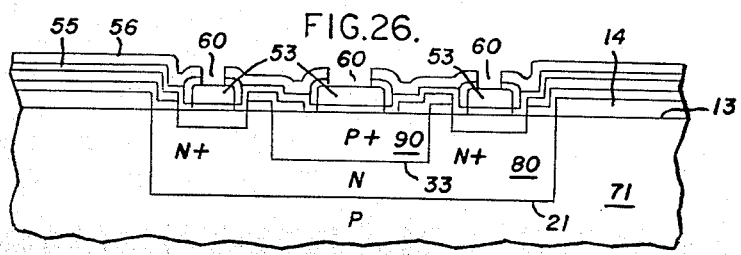
FIG. 26 is a cross-sectional view of another embodiment of the invention formed by the method illustrated in FIGS. 13 through 25.

The completed semiconductor device is shown in FIG. 26. The device corresponds to that shown in FIG. 12, except that the N, N+, and P regions are not in the same location. Additionally, a thin N+ region has been incorporated in the N region.

Although not shown as specific embodiments, it will be obvious to those skilled in the art that the invention may be embodied in many semiconductor devices. This would include diodes, PNPN switches, integrated circuits, and in general those semiconductor devices that are dependent on control of the surface properties of the semiconductor chip.

Thus, while two specific embodiments of the invention have been described, it will be obvious to those skilled in the art that changes and modifications may be made without departing from the invention. It is therefore intended in the appended claims to cover all such changes and modifications that fall within the true spirit and scope of the invention.

What is claimed as new and desired to be secured by letters patent of the United States is:

1. A method of manufacture for a semiconductor device comprising the steps of:

diffusing impurities into a silicon semiconductor chip through photolithographic techniques, wherein said diffusing step leaves said chip coated with silicon dioxide;

forming contact windows in said silicon dioxide so as to expose the underlying silicon at selected areas;

coating said silicon dioxide and the peripheral portions of said selected areas with a barrier layer of pyrolytic silicon nitride;

forming platinum silicide on the remaining exposed portions of said silicon and forming metallic electrical contacts on the platinum silicide;

forming a layer of low-temperature silicon dioxide on said silicon nitride and said contacts;

depositing a layer of glass on said layer of low-temperature silicon dioxide, said glass being deposited by the substeps of:

depositing a first layer of particulate glass and applying heat to cause fusion; and depositing a second layer of particulate glass and applying heat to cause fusion; and forming openings in said glass and said low temperature silicon oxide to provide access to said contacts.

2. The method of claim 1 wherein said low temperature layer of silicon dioxide is approximately 600 A thick, said first thin coating of glass is approximately 1.2 microns thick, and said second thin coating of glass is approximately 0.4 micron thick.

* * * * *